United States Patent [19]

Stanley

[11] Patent Number: 4,846,930

[45] Date of Patent: Jul. 11, 1989

[54] MOUNTING A COMPONENT TO A SUBSTRATE

[75] Inventor: Ian W. Stanley, Ipswich, England

[73] Assignee: British Telecommunications Public Limited Company, Great Britain

[21] Appl. No.: 80,564

[22] PCT Filed: Oct. 16, 1986

[86] PCT No.: PCT/GB86/00627

§ 371 Date: Jun. 11, 1987

§ 102(e) Date: Jun. 11, 1987

[87] PCT Pub. No.: WO87/02518

PCT Pub. Date: Apr. 23, 1987

[30] Foreign Application Priority Data

Oct. 16, 1985 [GB] United Kingdom ............... 8525458
Oct. 16, 1985 [GB] United Kingdom ............... 8525459
Oct. 16, 1985 [GB] United Kingdom ............... 8525460
Oct. 16, 1985 [GB] United Kingdom ............... 8525461
Oct. 16, 1985 [GB] United Kingdom ............... 8525462
Oct. 23, 1985 [GB] United Kingdom ............... 8526189

[51] Int. Cl.$^4$ .................... H01L 21/306; B44C 1/22; H01S 3/08
[52] U.S. Cl. .................... 156/633; 156/643; 156/647; 156/648; 156/662; 357/74; 372/107
[58] Field of Search ............. 156/629, 633, 643, 647, 156/648, 662; 204/192.34, 192.35, 192.37; 437/3, 129; 357/19, 30, 55, 74, 76; 372/107, 109

[56] References Cited

U.S. PATENT DOCUMENTS 4,546,478 10/1985 Shimizu et al. ................... 372/36

FOREIGN PATENT DOCUMENTS 0006042 12/1979 European Pat. Off. .
0129048 12/1984 European Pat. Off. .
3138296 4/1983 Fed. Rep. of Germany .
3307669 9/1984 Fed. Rep. of Germany .
2549243 1/1985 France .

OTHER PUBLICATIONS

Patents Abstracts of Japan, vol. 9, No. 27 (E-294) (1750) 6 Feb. 1985; JP, A, 59-172787, (Sharp K.K.) 29 Sep. 1984.
IBM Technical Disclosure Bulletin, vol. 22, No. 7, Dec. 1979, IBM Corp. New York, U.S., L. D. Comerford: "Etched Silicon Structure for Aligning a Photodiode and Optical Fiber", pp. 2935-2936.

Primary Examiner—William A. Powell
Attorney, Agent, or Firm—Nixon & Vanderhye

[57] ABSTRACT

A method of mounting an optical component such as a laser chip on a substrate. The method involves mounting the chip on a bridge and positioning the bridge on the substrate. Depending legs are provided on the bridge so that the bridge is located in the vertical direction relatively to the substrate and hence the laser chip is also located. Finally, the chip is secured to the substrate by, for example, soldering.

7 Claims, 2 Drawing Sheets

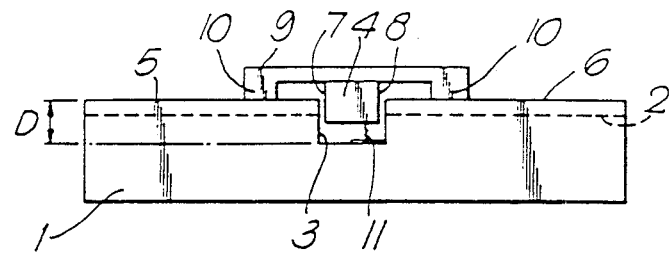
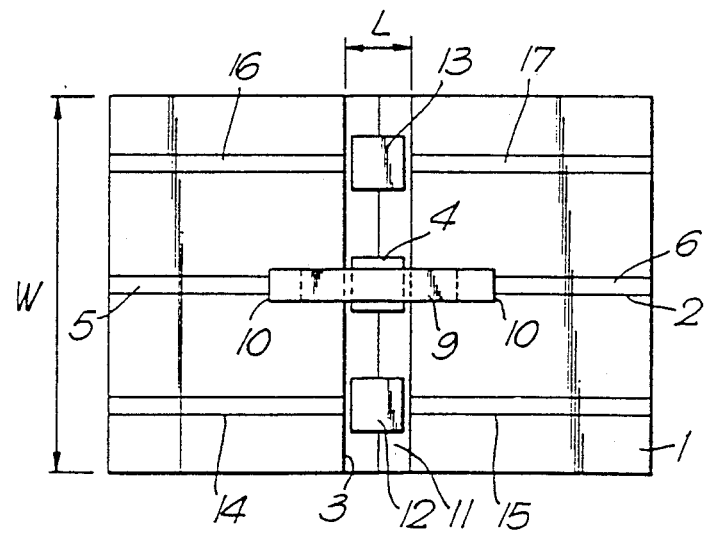

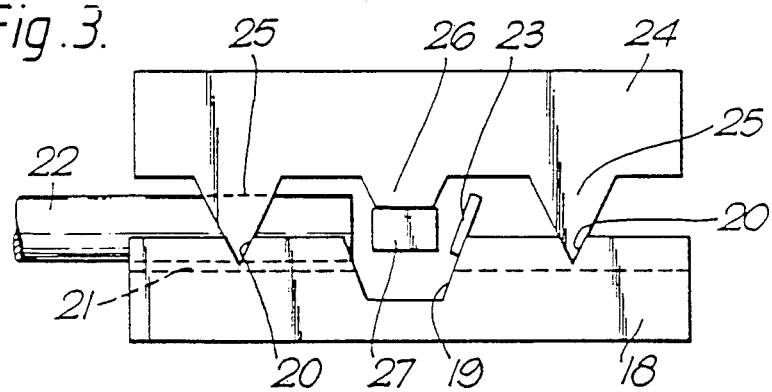
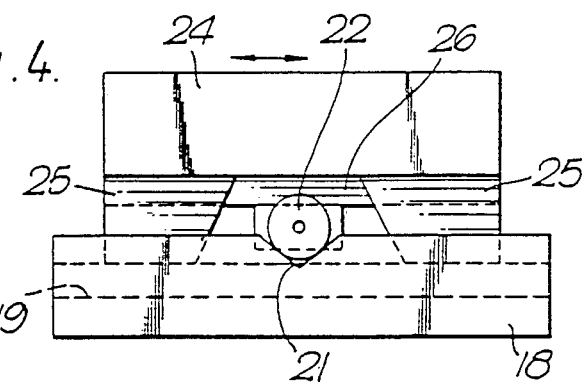
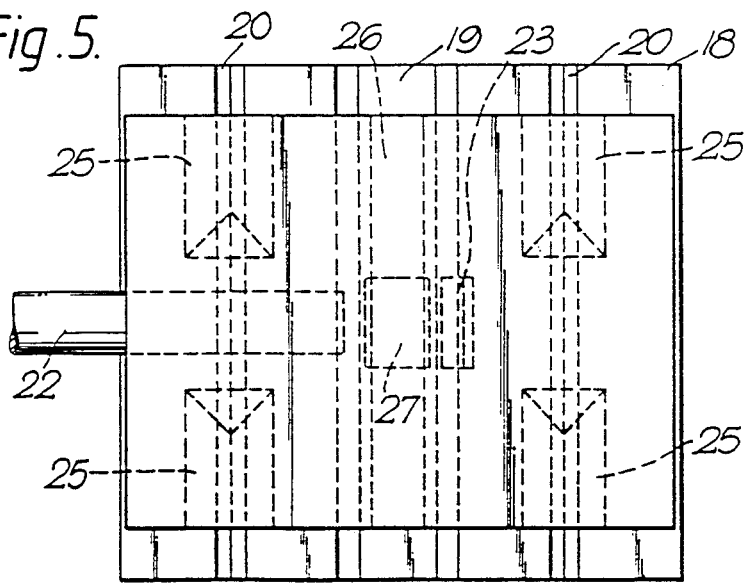

MOUNTING A COMPONENT TO A SUBSTRATE

The invention relates to a method of mounting a component to a substrate, for example the mounting of an optical component such as a laser chip to a substrate.

Recent developments in optical technology have led to the construction of laser chips and photosensor chips which have relatively small dimensions of the order of 200 microns. It is now proposed that these components should be mounted on substrates and accurately aligned with optical waveguides or other optical components. One of the difficulties with this is that it is difficult to hold the component accurately using a micromanipulator or the like during mounting of the component on a substrate.

A paper by M. Kobayashi et al entitled "Guided-Wave optical gate matrix switch" in the Proc. 11th European Conference on Optical Communication (pages 73-76) describes the mounting of a laser diode to a silicon heat sink. The heat sink is a slab of silicon which is apparently laid on the substrate. The laser diode cannot, however, be accurately positioned on the substrate.

In accordance with one aspect of the present invention, a method of mounting a component on a substrate comprises mounting the component on a support; positioning the support on the substrate, wherein at least one of the support and the substrate includes locator means such that the support is located in at least one direction relatively to the substrate; and securing the component to the substrate.

The location of the support in at least one direction relatively to the substrate automatically locates the component also in that direction. Thus, the locator means can be positioned remotely of the component and will not interfere with the mounting of the component.

In accordance with a second aspect of the present invention we provide in combination a component secured to a substrate, the combination further comprising a support to which the component is mounted, at least one of the support and the substrate including locator means for locating the support in at least one direction relatively to the substrate.

In one simple arrangement, the locator means comprises two or more legs positioned on either the support or the substrate, the support being positioned on the legs spaced from the substrate by a predetermined amount determined by the length of the legs.

Preferably, however, complementary locating portions are formed in the support and the substrate. This has the advantage that the support is located in two directions relative to the substrate.

For example, the locating portions may comprise complementary ridges and recesses. Where the substrate comprises a single crystal such as silicon it is particularly convenient if the complementary ridges and recesses have a V-shaped cross-section since these can be formed using known masking and anisotropic etching techniques.

The component may be directly bonded to the substrate, for example by soldering, or indirectly by bonding the support to the substrate. Preferably, both the support and component are bonded to the substrate.

Some examples of methods and combinations in accordance with the invention will now be described with reference to the accompanying drawings, in which:

FIG. 1 is a side elevation of a first example with some parts omitted for clarity;

FIG. 2 is a plan of the first example with some parts omitted for clarity; and,

FIGS. 3, 4, and 5 are a side elevation, partial end elevation, and plan respectively of a second example.

FIGS. 1 and 2 illustrate a lithium niobate substrate 1. Titanium is diffused into a narrow rectilinear section 2 of the top surface of the substrate 1 to define an optical waveguide by modifying the refractive index of the substrate. A generally U-shaped recess or slot 3 is then cut in the surface of the substrate 1 orthogonal to the waveguide 2 by using a suitable technique such as ion beam milling or reactive ion etch. As can be seen in FIG. 1, the slot 3 has a rectangular cross-section. It will be seen that the formation of the slot 3 divides the optical waveguide 2 into two subsidiary optical waveguides 5, 6 which are automatically in alignment with one another. A conventional laser chip 4 is then mounted in the slot 3 (by a method to be described below) with opposite facets 7, 8 in alignment with the subsidiary waveguides 6, 5 respectively.

The depth (D) of the slot 3 is chosen so that the light emitting stripe in the laser chip 4 is matched to the optical waveguides 5, 6. The length (L) of the slot 3 is chosen to allow the maximum possible light transmission between the laser chip 4 and the substrate 1 and it can be tailored to suit a given chip length. The third dimension (W) is not critical and is chosen to allow adjustment of the laser chip 4 along the slot 3 to enable the optimum position of the laser chip relatively to the optical waveguides 5, 6 to be found and to permit a number of chips to be mounted side by side.

Typically, L is about 200 $\mu$m and D<15 $\mu$m.

To mount the laser chip 4, the laser chip is initially soldered to the undersurface of a metal bridge 9. The bridge 9 has a pair of integral depending legs 10 which rest on an upper surface of the substrate 1 with the laser chip 4 suspended in the slot 3. This locates the laser chip 4 in the vertical direction by controlling the extent to which the laser chip 4 is received in the slot 3. Furthermoore, it is easier for a micromanipulator to hold the bridge 9 than the laser chip itself. Optimum alignment of the laser chip 4 with the optical waveguides 5, 6 is achieved using an optical method by monitoring the power transmitted along the waveguides while the activated laser chip is moved along the slot 3. Once the optimum position has been found, corresponding to maximum power coupling with the waveguides 5, 6, the laser chip 4 and the legs 10 of the bridge 9 are soldered to the substrate 1.

There are a number of advantages in providing two optical waveguides 5,6. In general, the spectral performance of conventional laser chips needs to be improved and this can be achieved by monitoring the laser output from the facet 8 while the main laser output is generated from the facet 7. In addition, this access to both facets could be used in a combined transmitter/receiver or simply to monitor the output power.

A transverse lower connection 11 to the laser chip 4 extends along the base of the slot 3 (FIG. 2).

One of the advantages of providing an elongate slot 3 is that a number of laser chips could be mounted side by side. This is shown in FIG. 2 where additional laser chips 12, 13 are provided in alignment with optical waveguides 14, 15; 16, 17 respectively, each pair having a similar form to the optical waveguides 5, 6. In FIG. 2, bridges corresponding to the bridge 9 and supporting the laser chips 12, 13 have been omitted.

The advantage of lithium niobate is that it can be used to form electro-optic components which would be incorporated into areas of the substrate adjacent the slot 3 with suitable connections being made with the optical waveguides.

FIGS. 3 to 5 illustrate a second example in which a silicon substrate 18 is used. One of the advantages of silicon is that it can be very accurately etched using its anisotropic etching properties to produce grooves with depths accurate to 1 micron and with accurately determined included angles. In the example shown in FIGS. 3 to 5, initially a flat bottomed channel 19 is formed having a generally U-shaped cross-section with sloping sides by etching the 111 faces of the crystal. Subsequently a pair of parallel V-shaped grooves 20 are etched parallel with the channel 19 and on either side of the channel 19. A V-shaped groove 21 is etched at right angles to the channel 19 and grooves 20, having a depth approximately equal to half the diameter of a monomode optical fibre 22 which is subsequently to be mounted in the groove.

A photodiode 23 is bonded (eg. soldered) to the sloping surface of the channel 19 facing the optical fibre 22.

A second silicon substrate or chip 24 is provided which corresponds to the bridge 9 in the previous example. The chip 24 has two pairs of depending, V-shaped ridges 25 and a central depending ridge 26. The included angle of each ridge 25 is substantially the same as the included angle of the V-shaped grooves 20 in the substrate 18.

A laser diode 27 is bonded to the ridge 26.

The substrate 24 is then mounted on the substrate 18 with each pair of ridges 25 being received in the corresponding groove 20 and straddling the groove 21. The depth of the grooves 20 and the height of the ridge 26 are chosen such that when the substrate 24 is mounted on the substrate 18, the laser diode 27 is accurately located and aligned with an optical fibre 22 in the groove 21 (FIG. 4).

The provision of the grooves 20 and complementary ridges 25 assists in accurately positioning the laser diode 27 in two directiins and this should be contrasted with the previous example in which the bridge 9 permits a certain degree of movement transverse to the slot 3.

A feature of this example is that the position of the laser diode 27 with respect to the optical fibre 22 can be adjusted in the direction of the grooves 20 to obtain maximum power coupling into the optical fibre. In addition, the separation of the end of the optical fibre 22 from the laser diode 27 can also be altered by sliding the fibre within the groove 21. Once the correct relative positions have been found, the upper and lower silicon substrate 18, 24 are bonded together in such a way that the laser diode attachment to the upper silicon chip 24 is unaffected. In addition, the optical fibre 22 is bonded into the groove 21. Bonding may be achieved using soldering or any other known technique.

The photodiode 23 may be used for a variety of purposes similar to those outlined in the previous example for monitoring laser emission from the facet of the laser diode 27 opposite to the optical fibre 22.

In a modification of this example (not shown) the upper substrate 24 may include a further depending ridge which clamps the optical fibre 22 into the groove 21.

I claim:

1. A method of mounting a component on a substrate, the method comprising:
   mounting the component on an undersurface of a bridge-shaped support;
   positioning the support on the substrate with the component located between the support and the substrate, wherein at least one of the support and the substrate includes locator means such that the support is located in at least one direction relatively to the substrate; and
   securing the support to the substrate.

2. A method according to claim 1, further comprising prior to the positioning step, providing the locator means by forming complementary locating portions in the support and the substrate.

3. A method according to claim 2, wherein the substrate and support comprise single crystals, the method further comprising anisotropically etching the substrate and support to produce the complementary locating portions.

4. A component mounted onto a substrate in accordance with the method of claim 1, 2 or 3.

5. A method of mounting a laser component on a substrate in accurate optical signal alignment with an optical waveguide component, said method comprising the steps of:
   mounting said laser component between projecting legs of a support structure;
   positioning said legs onto said substrate to accurately align an optical signal output of said laser component with an optical waveguide component also supported by said substrate; and
   securing said support structure to said substrate in such aligned position with the laser component disposed between the support structure and the substrate.

6. A method as in claim 5 wherein said positioning step includes sliding said legs in one dimension along a matingly engaged guide path of said substrate which predefines accurate positioning of the laser component in at least one dimension transverse to said guide path.

7. A method as in claim 5 or 6 wherein said legs have a predetermined length which predefines accurate positioning of the laser component in at least one dimension.

* * * * *